US012760403B2

(12) United States Patent
Ahn et al.

(10) Patent No.: US 12,760,403 B2
(45) Date of Patent: Oct. 13, 2026

(54) DEPOSITION DEVICE

(71) Applicant: Samsung Display Co., LTD., Yongin-si (KR)

(72) Inventors: Jung Hyun Ahn, Yongin-si (KR); Jaesuk Moon, Yongin-si (KR); Seung Jin Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 456 days.

(21) Appl. No.: 18/468,863

(22) Filed: Sep. 18, 2023

(65) Prior Publication Data

US 2024/0093347 A1 Mar. 21, 2024

(30) Foreign Application Priority Data

Sep. 19, 2022 (KR) ........................ 10-2022-0118201

(51) Int. Cl.

| | |
|---|---|
| ***C23C 14/04*** | (2006.01) |
| ***C23C 14/12*** | (2006.01) |
| ***C23C 14/50*** | (2006.01) |
| ***H10K 71/16*** | (2023.01) |

(52) U.S. Cl.

CPC ............ *C23C 14/042* (2013.01); *C23C 14/12* (2013.01); *C23C 14/50* (2013.01); *H10K 71/166* (2023.02)

(58) Field of Classification Search

CPC ........ C23C 14/12; C23C 14/042; C23C 14/50

See application file for complete search history.

(56) References Cited

U.S. PATENT DOCUMENTS

| | | | | |
|---|---|---|---|---|
| 2010/0025237 A1* | 2/2010 | Kim | C23C 14/042 | 204/298.18 |
| 2015/0056370 A1* | 2/2015 | Lee | C23C 14/042 | 118/721 |
| 2024/0026519 A1 | 1/2024 | Ahn et al. | | |

FOREIGN PATENT DOCUMENTS

| | | |
|---|---|---|
| KR | 10-1757182 | 7/2017 |
| KR | 10-1761584 | 7/2017 |
| KR | 10-2253601 | 5/2021 |
| KR | 10-2024-0013938 | 1/2024 |

* cited by examiner

*Primary Examiner* — Joseph A Miller, Jr.

(74) *Attorney, Agent, or Firm* — CANTOR COLBURN LLP

(57) ABSTRACT

An embodiment provides a deposition device including a magnet part that includes magnets; and a substrate support that faces the magnet part and that supports a substrate, the substrate support includes a support plate and patterns formed on a first surface of the support plate, and each of the patterns corresponds to a space between neighboring magnets among the magnets or corresponds to the magnets.

17 Claims, 16 Drawing Sheets

DEPOSITION DEVICE

CROSS-REFERENCE TO RELATED APPLICATION(S)

This application claims priority to and benefits of Korean Patent Application No. 10-2022-0118201 under 35 U.S.C. § 119, filed in the Korean Intellectual Property Office on Sep. 19, 2022, the entire contents of which are incorporated herein by reference.

BACKGROUND

1. Technical Field

The disclosure relates to a deposition device, and to an organic material deposition device.

2. Description of the Related Art

A process of manufacturing a semiconductor device such as for various display devices may include a process of depositing a layer on a substrate. The deposition process may be performed in a vacuum chamber, and a deposition mask for defining an area to be deposited on the substrate is positioned on the substrate.

As an example of a semiconductor device, a display device may include two electrodes formed on a substrate and a light emitting layer disposed therebetween to form a light emitting device. Electrons injected from one electrode of the light emitting device and holes injected from another electrode are combined in an organic light emitting layer to form excitons. The excitons may output energy and emit light while changing from an excited state to a ground state.

A display device may include pixels capable of emitting light of different colors, and each pixel may include a light emitting device.

The light emitting layer of the light emitting device may include organic materials that emit light of primary colors represented by different pixels. In the display device, various insulating layers and encapsulation layers may be formed of organic materials. For deposition of such an organic layer, a deposition mask having an opening may be positioned on the substrate. The deposition mask may be a metal mask including a metal. A magnet may be used to carry out the deposition process by closely adhering the deposition mask to the substrate.

The above information disclosed in this background section is only for enhancement of understanding of the background of the disclosure, and therefore, it may contain information that does not form the prior art that may already be known to a person of ordinary skill in the art.

SUMMARY

The disclosure has been made in an effort to provide a deposition device for controlling a magnetic force by a magnet for adhering a deposition mask onto a substrate in a deposition process for manufacturing a display device, thereby resolving poor visibility of stripes in an image displayed by the display device.

An embodiment provides a deposition device that may include a magnet part that includes magnets; and a substrate support that faces the magnet part and supports a substrate, wherein the substrate support may include a support plate and patterns formed on a first surface of the support plate, and each of the patterns corresponds to a space between neighboring magnets among the magnets or corresponds to the magnets.

The magnets may be disposed in a first direction, and the patterns may be disposed in the first direction.

The magnet part may extend in a second direction that is perpendicular to the first direction, and the patterns may extend in the second direction.

A center of each of the patterns may be aligned with a center of a space between neighboring ones of the magnets.

A center of each of the patterns may be aligned with a center of a corresponding one of the magnets.

The first surface of the support plate may face the substrate.

A first side of the support plate may face the magnet part.

A thickness of the patterns in a third direction may be less than a thickness of the support plate in the third direction, a second direction is perpendicular to the first direction, and the third direction is perpendicular to the first direction and the second direction.

The substrate support may include protrusions facing the substrate, the patterns may be disposed between adjacent protrusions, and a thickness of the patterns in the third direction may be less than a thickness of the protrusions in the third direction.

The substrate support may be disposed between the magnet part and the substrate.

A pitch of the magnets in the first direction may be substantially equal to a pitch of the patterns in the first direction.

The deposition device may further include a deposition mask disposed below the substrate, and the substrate support may be disposed between the magnet part and the deposition mask.

The support plate may include a non-magnetic material, and the patterns may be magnetic.

The support plate may include a refrigerant.

An embodiment provides a deposition device that may include a magnet part that includes magnets disposed in a first direction; and a substrate support, wherein the substrate support may include a support plate that has a first surface facing the magnet part and a second surface opposite to the first surface; and patterns formed on the first surface or the second surface and disposed in the first direction.

The magnet part may extend in a second direction that is perpendicular to the first direction, and the patterns may extend in the second direction.

A center of each of the patterns may be aligned with a center of a space between neighboring ones of the magnets or a center of each of the magnets.

The patterns may include a magnetic material.

A substrate may be disposed at a side of the second surface of the substrate support, and the substrate support may be disposed between the magnet part and the substrate.

An embodiment provides a deposition device that may include a magnet part that includes magnets; and a substrate support, wherein the substrate support may include a support plate that has a first surface facing the magnet part and a second surface that supports a substrate; and patterns formed on the first surface or the second surface to distort a magnetic force of the magnet part.

According to the embodiments, it is possible to control a magnetic force by a magnet for adhering a deposition mask onto a substrate in a deposition process for manufacturing a display device, thereby resolving poor visibility of stripes in an image displayed by the display device.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
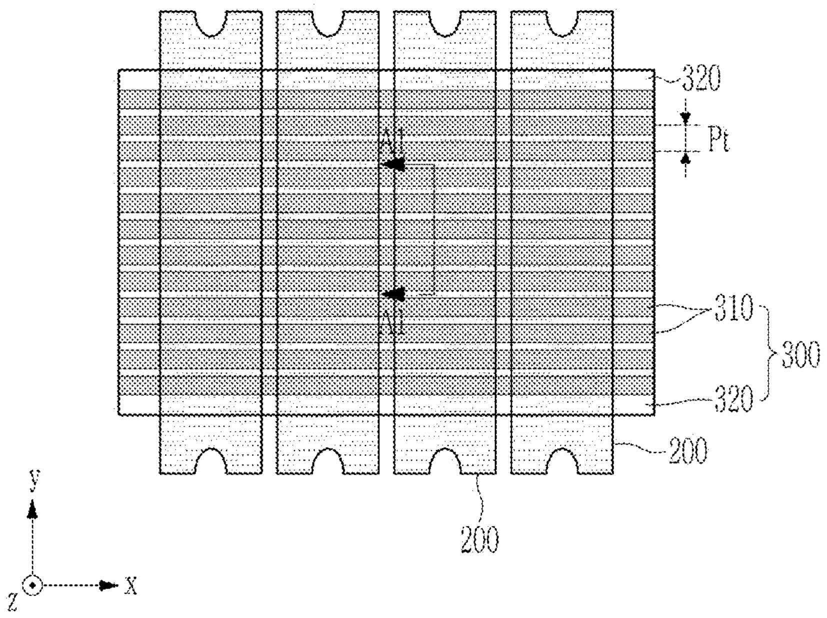
FIG. 1 illustrates a schematic top plan view showing a disposition of a magnet unit and a deposition mask included in a deposition device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

To clearly describe the disclosure, parts that may be irrelevant to the description may be omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof.

Further, throughout the specification, the phrase "in a plan view" means when an object portion is viewed from above, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A deposition device according to an embodiment will be described with reference to FIG. 1 to FIG. 5.

Figure 2:
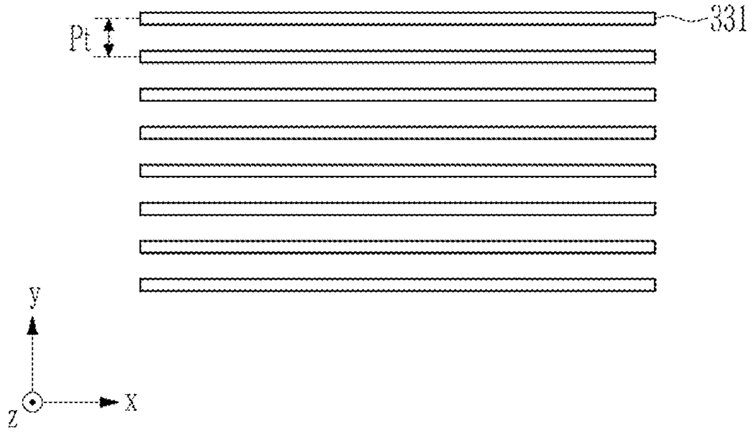
FIG. 2 illustrates a schematic top plan view showing a disposition of magnets of a magnet unit included in a deposition device according to an embodiment.
Figure 3:
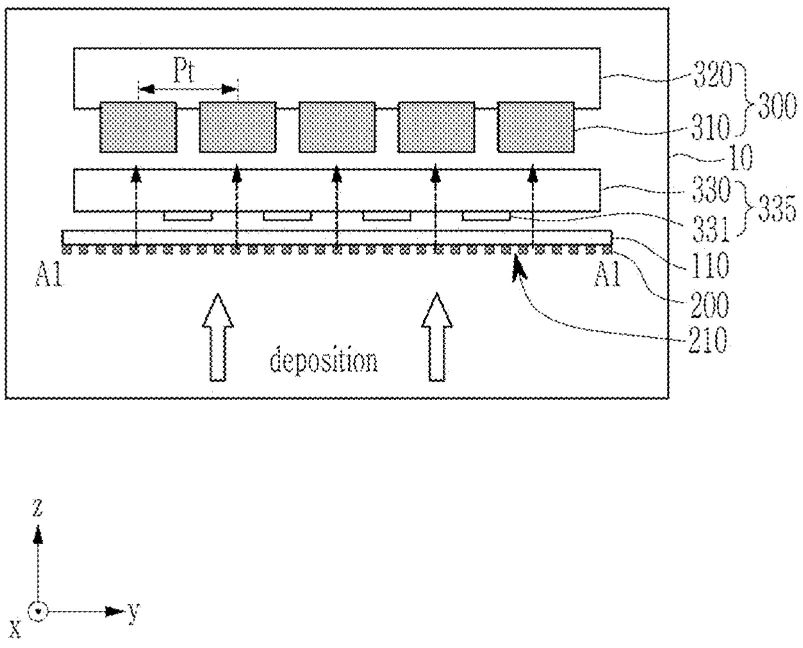
FIG. 3 illustrates a schematic cross-sectional view showing a configuration of a deposition device according to an embodiment, including a schematic cross-sectional view illustrating the deposition device of FIG. 1 taken along line A1-A1.

FIG. 1 illustrates a schematic top plan view showing a disposition of a magnet unit or magnet part and a deposition mask included in a deposition device according to an embodiment, FIG. 2 illustrates a schematic top plan view showing a disposition of magnets of a magnet unit included in a deposition device according to an embodiment, and FIG. 3 illustrates a schematic cross-sectional view showing a configuration of a deposition device according to an embodiment, including a schematic cross-sectional view illustrating the deposition device of FIG. 1 taken along line A1-A1.

Referring to FIG. 1 to FIG. 3, according to an embodiment, the deposition device may include a chamber 10, a magnet unit 300, and a substrate support 335 for supporting a substrate 110.

Referring to FIG. 3, the deposition device according to an embodiment may deposit an organic layer for forming, for example, an emission layer of a light emitting device included in a pixel of a display device, and a deposition material may be deposited in a direction of an arrow shown in FIG. 3 inside the chamber 10. The deposition material may include various organic materials. The deposition material may be deposited on a selectable area on the substrate 110 through an opening 210 of the deposition mask 200 positioned in close contact with a lower portion of the substrate 110.

The magnet unit 300 may include magnets 310 and a yoke plate 320.

Referring to FIG. 1, each of the magnets 310 may have a shape elongated in an x-direction, for example. The magnets 310 may be arranged or disposed in a y direction orthogonal to the x direction. The adjacent magnets 310 may be magnets of different poles.

A y-directional pitch Pt of the magnets 310 may be constant throughout the magnet unit 300, but the disclosure is not limited thereto.

The yoke plate 320, which is for fixing the magnets 310, may be in the form of a plate parallel to an x-direction and a y-direction, for example, an xy plane. The yoke plate 320 may have magnetism to fix the magnets 310.

Referring to FIG. 1, deposition masks 200 may be provided, but a number of deposition masks 200 is not particularly limited. The deposition masks 200 may be approximately arranged or disposed in the x direction.

Referring to FIG. 3, the substrate support 335 may be movable or fixed within the chamber 10. The substrate support 335 faces the magnet unit 300, and may be positioned between the magnet unit 300 and the substrate 110. A lower surface of the substrate support 335 may face the substrate 110, and may support the substrate 110.

The substrate support 335 may include a support plate 330 in the form of a plate parallel to the xy plane.

The substrate support 335 may further include patterns 331. The patterns 331 may be formed on a surface of surfaces of the support plate 330, which faces the substrate 110. For example, in case that the surface facing the magnet unit 300 among the surfaces of the support plate 330 of the substrate support 335 is referred to as an upper surface and an opposite surface is referred to as a lower surface, the patterns 331 may be formed on the lower surface of the support plate 330. In the schematic cross-sectional view illustrated in FIG. 3, each of the patterns 331 protrudes downward from the lower surface of the support plate 330, but the disclosure is not limited thereto, and may be formed in a fine hole toward an inside of the support plate 330.

Although a cross-sectional shape of the pattern 331 is illustrated as having a rectangular shape in a schematic cross-sectional view, the disclosure is not limited thereto. According to an embodiment, the cross-section shape of the pattern 331 may be a semi-circle or a semi-ellipse, and may have various other shapes.

Referring to FIG. 2, each of the patterns 331 of the substrate support 335 may have a shape elongated in the x direction. The patterns 331 may be arranged or disposed in the y direction. Referring to FIG. 2 and FIG. 3, a center of each pattern 331 of the substrate support 335 may be generally aligned with a center of a space between the adjacent magnets 310 included in the magnet unit 300. A y-directional pitch Pt of the patterns 331 may be the same as the y-direction pitch Pt of the magnets 310.

In case that the deposition mask 200 is positioned under or below the substrate 110 to perform the deposition process, the substrate 110 may be positioned between the substrate support 335 and the deposition mask 200. In case that the magnet unit 300 is positioned at an opposite side of the substrate 110 with the substrate support 335 provided therebetween, the deposition mask 200 may be fixed in close contact with the substrate 110 by the magnetism of the magnets 310 of the magnet unit 300.

Figure 4:
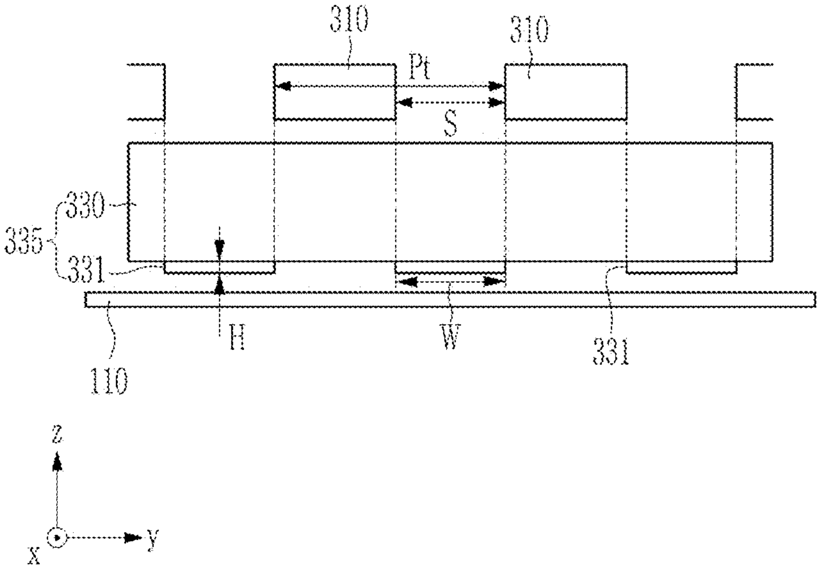
FIG. 4 illustrates a schematic cross-sectional view of a substrate support included in a deposition device according to an embodiment.
Figure 5:
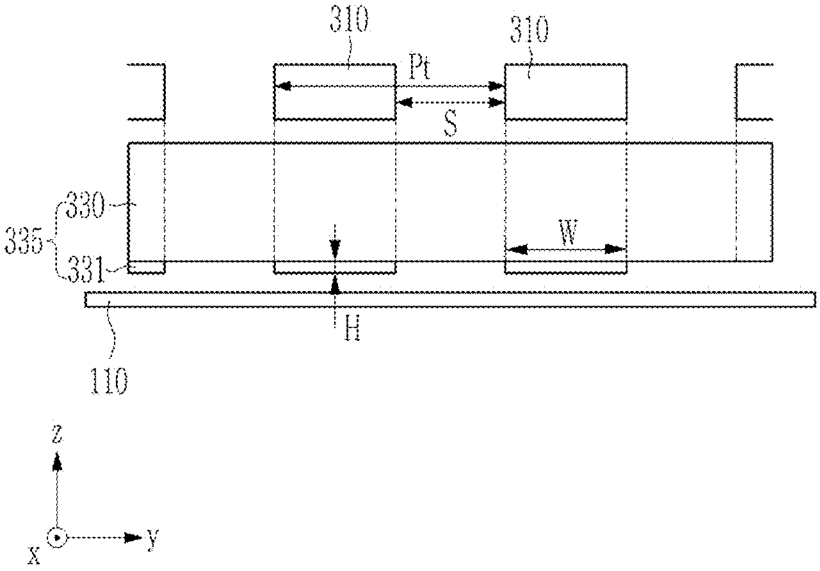
FIG. 5 illustrates a schematic cross-sectional view of a substrate support included in a deposition device according to an embodiment.

FIG. 4 and FIG. 5 each illustrate a schematic cross-sectional view of a substrate support included in a deposition device according to an embodiment.

Referring to FIG. 4, the pattern 331 included in the substrate support 335 may be positioned to correspond to a space between the corresponding adjacent magnets 310 among the magnets 310 of the magnet unit. A y-directional width W of the pattern 331 may be the same as or different from a y-directional width S of the space between the corresponding neighboring magnets 310. As described above, the y-directional pitch Pt of the magnets and the y-direction pitch Pt of the patterns 331 of the substrate support 335 may be the same.

Referring to FIG. 5, in the pattern 331 included in the substrate support 335 according to an embodiment, a center of the pattern 331 may be positioned to correspond to a center of each magnet 310 corresponding to the magnet unit. The y-directional width W of the pattern 331 may be the same as or different from a y-directional width of the corresponding magnet 310. As described above, the y-directional pitch Pt of the magnets and the y-direction pitch Pt of the patterns 331 of the substrate support 335 may be the same.

A z-directional thickness H of the pattern 331 may be smaller than a z-directional thickness of the support plate 330.

The support plate 330 may include a non-magnetic material, for example, a metal such as aluminum (Al). The support plate 330 may cool the substrate 110. To this end, a refrigerant may circulate inside the support plate 330.

The pattern 331 may include a magnetic material. The pattern 331 may be formed on a lower surface of the support plate 330 by using an etching process, a plating process, or the like within the spirit and the scope of the disclosure.

Effects of the display device according to an embodiment will be described along with comparative embodiments with reference to FIG. 6 to FIG. 15 together with FIG. 1 to FIG. 5.

Figure 6:
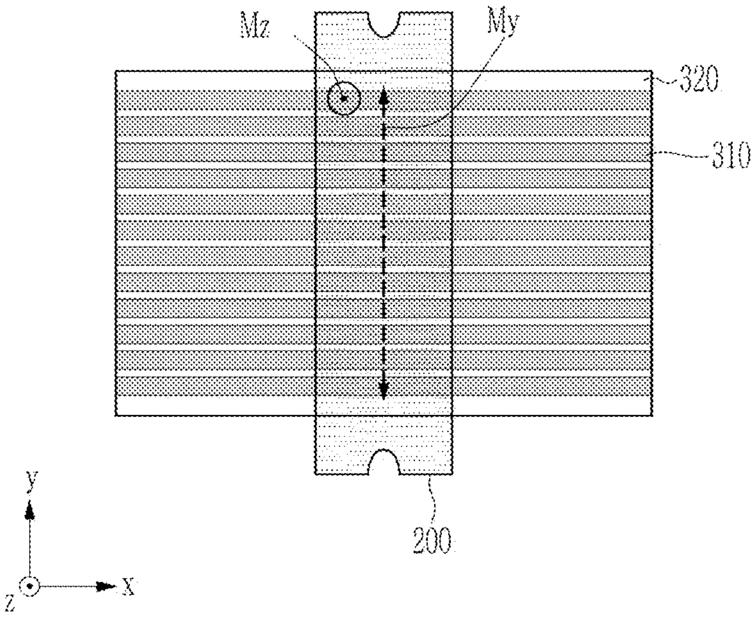
FIG. 6 illustrates a schematic top plan view of a magnet unit included in the deposition device according to an embodiment.
Figure 7:
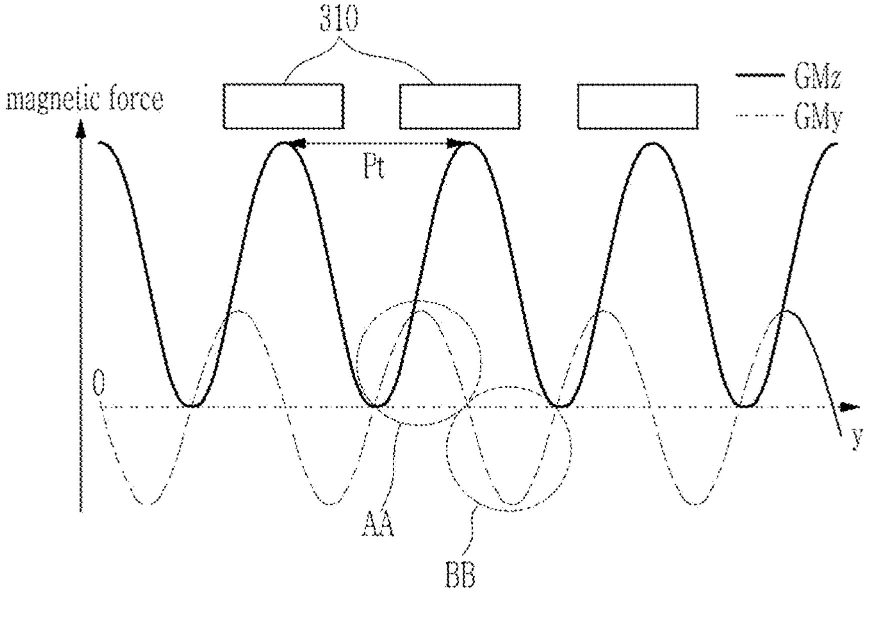
FIG. 7 illustrates a graph showing a magnetic force caused by a magnet unit included in a deposition device according to a comparative embodiment.
Figure 8:
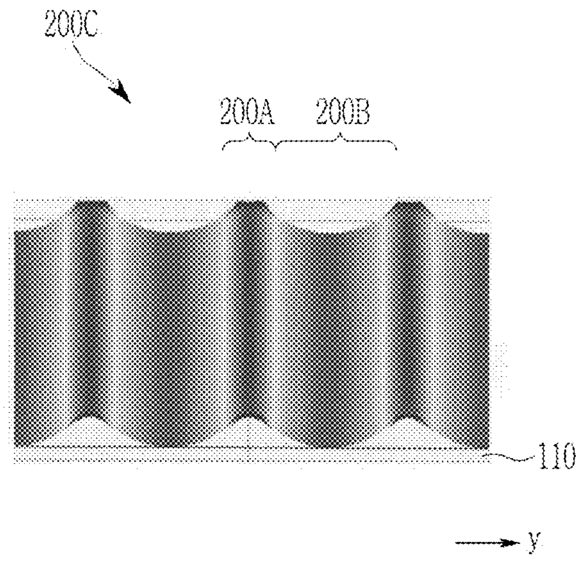
FIG. 8 illustrates a simulation result of a deposition mask that is bent by a magnetic force by a magnet unit included in a deposition device according to a comparative embodiment.

FIG. 6 illustrates a schematic top plan view of a magnet unit included in the deposition device according to an embodiment, FIG. 7 illustrates a graph showing a magnetic force caused by a magnet unit included in a deposition device according to a comparative embodiment, and FIG. 8 illustrates a simulation result of a deposition mask that is bent by a magnetic force by a magnet unit included in a deposition device according to a comparative embodiment.

Referring to FIG. 6 and FIG. 7, in the deposition device according to a comparative embodiment, the substrate support does not include the pattern 331, unlike in an embodiment, and has a lower surface and an upper surface which are flat.

FIG. 7 illustrates a graph showing strength of the magnetic force along the y direction by the magnets 310, and a first curve GMz represents a change in a z-directional magnetic force Mz in a direction parallel to the z direction as illustrated in FIG. 6. The z-directional magnetic force Mz may periodically change the pitch Pt of the magnets 310, and may be strongest in a region corresponding to a center of each magnet 310. The first curve GMz has an upper peak corresponding to the center of each magnet 310 and a lower peak corresponding to the center of the space between the neighboring magnets 310, and may change in an approximate sine shape.

A second curve GMy illustrated in FIG. 7 represents a change in a y-directional magnetic force My parallel to the y direction as illustrated in FIG. 6. The y-directional magnetic force My also periodically changes the pitch Pt of the magnet 310, but has a large absolute value at a point corresponding to the edge of each magnet 310, and may be close to zero in a region corresponding to the center of each magnet 310. The second curve GMy may have an upper peak corresponding to a first edge of each magnet 310 and a lower peak corresponding to a second edge of each magnet 310, and may change in an approximate sine shape. A direction of the y-directional magnetic force My in an area indicated by AA in FIG. 7 and a direction of the y-direction magnetic force My in an area indicated by BB may be opposite to each other.

According to this comparative embodiment, a deposition mask 200C may be changed into a periodically curved wave shape along the y direction as illustrated in FIG. 8 by the periodically changing z-direction magnetic force Mz and the y-direction magnetic force My with upper and lower peaks, thereby having a relatively pointed peak portion 200A and a valley portion 200B.

As such, according to the comparative example in which the substrate support does not include the patterns 331, unlike in this embodiment, a periodic deviation may occur in a thickness of a film deposited on the substrate 110 by the z-directional magnetic force Mz and the y-direction magnetic force My that change periodically with the upper peak and the lower peak, and the deposition mask 200C that is changed with a large curvature in the z direction by these magnetic forces. For example, a periodic deviation may occur in a thickness of an emission layer deposited for each pixel column of the display device.

Figure 9:
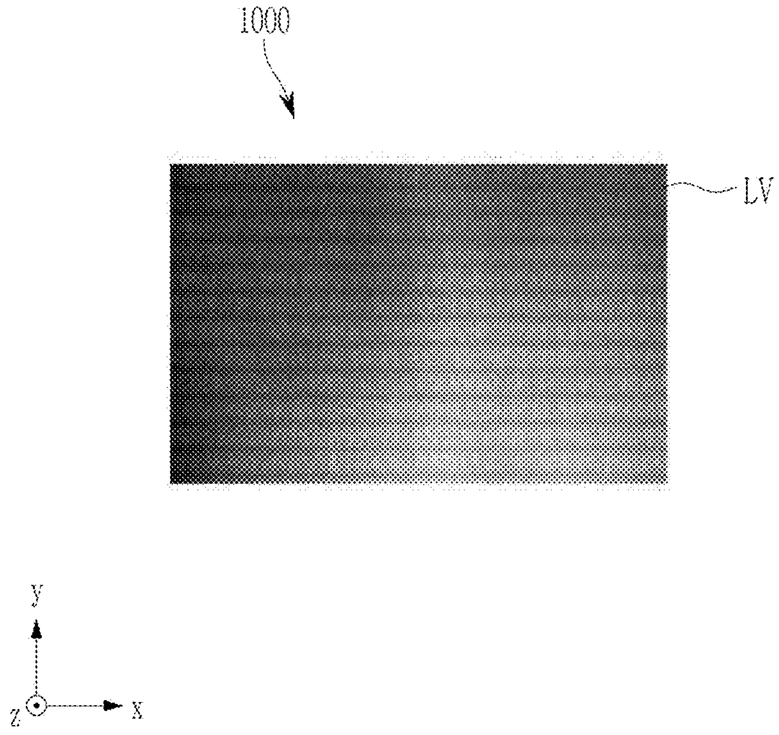
FIG. 9 illustrates a photograph showing a horizontal line defect of an image that is displayed by a display device manufactured by using a deposition device according to a comparative embodiment.

FIG. 9 illustrates a photograph showing a horizontal line defect of an image that is displayed by a display device manufactured by using a deposition device according to a comparative embodiment.

By way of example, FIG. 9 illustrates a defect in stripes LV, such as horizontal lines, that are visually recognized in case that a display device 1000 in which a film is deposited on the substrate 110 using the deposition device displays white according to the comparative embodiment. For example, as a z-directional thickness of the deposition mask 200C gradually decreases, a thickness distribution of the deposition mask 200C becomes relatively large, and a deviation of a magnetic force is relatively large.

Figure 10:
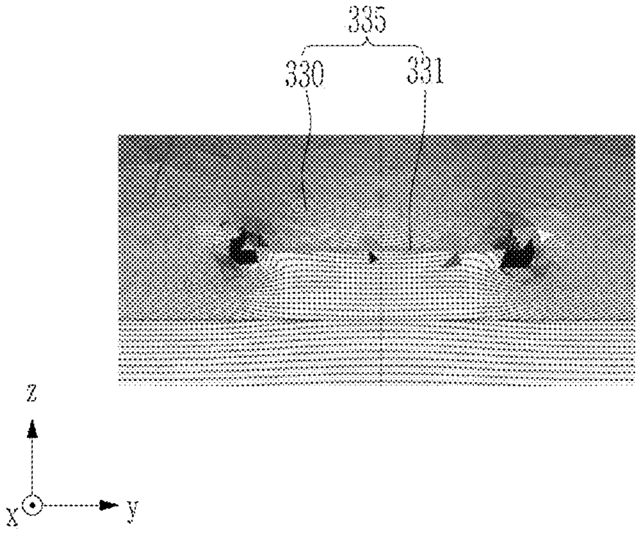
FIG. 10 illustrates a simulation result showing a magnetic force that is formed by a substrate support included in a deposition device according to an embodiment.
Figure 11:
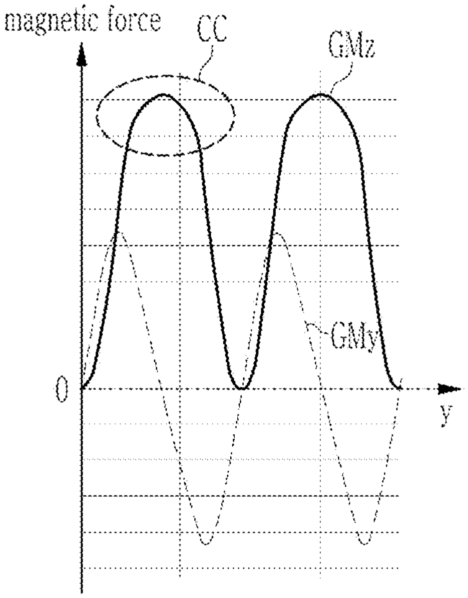
FIG. 11 illustrates a graph showing a result of changing a magnetic force by a magnet unit included in a deposition device by a substrate support according to an embodiment.
Figure 12:
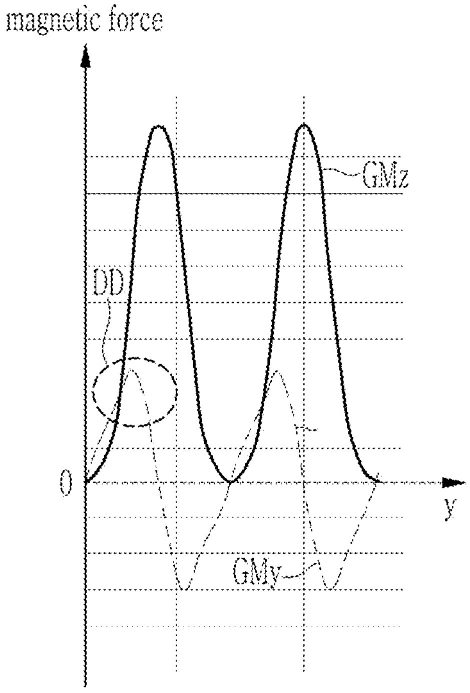
FIG. 12 illustrates a graph showing a result of changing a magnetic force by a magnet unit included in a deposition device by a substrate support according to an embodiment.
Figure 13:
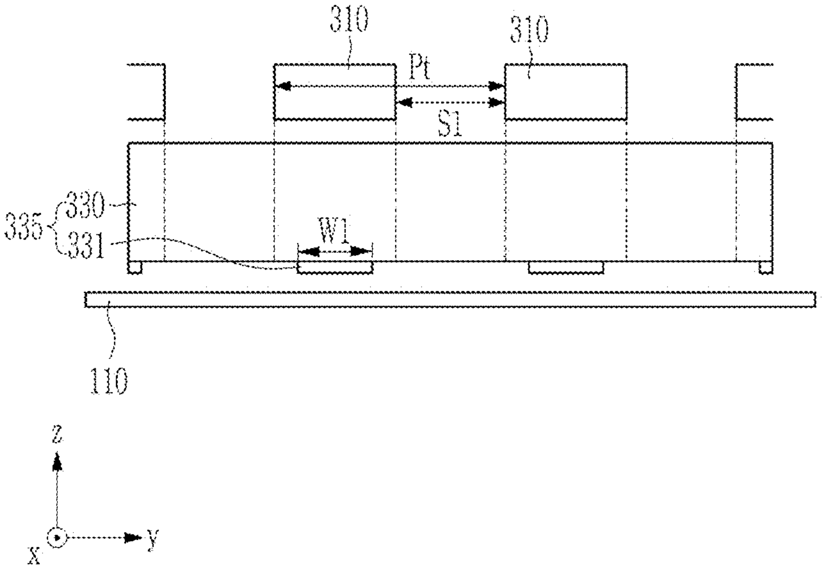
FIG. 13 illustrates a schematic cross-sectional view of a substrate support included in a deposition device according to an embodiment.
Figure 14:
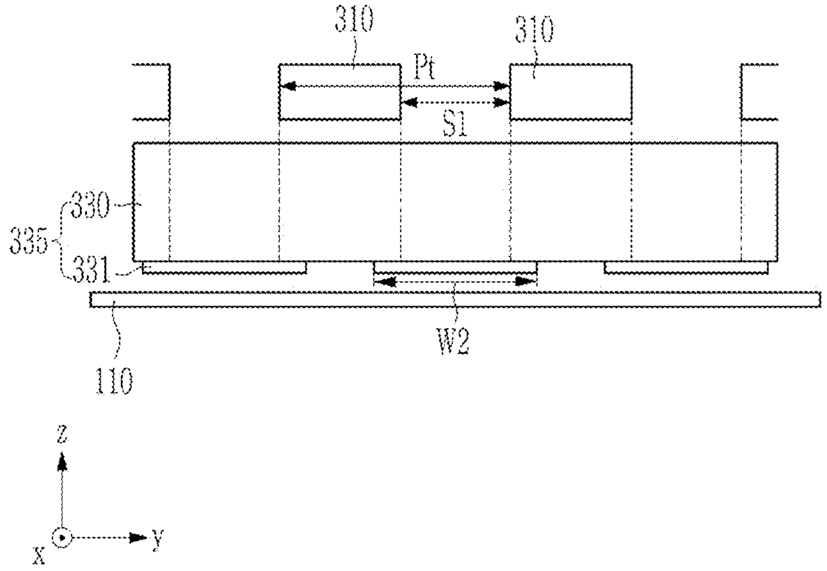
FIG. 14 illustrates a schematic cross-sectional view of a substrate support included in a deposition device according to an embodiment.

FIG. 10 illustrates a simulation result showing a magnetic force that is distorted by a substrate support included in a deposition device according to an embodiment, FIG. 11 illustrates a graph showing a result of changing a magnetic force by a magnet unit included in a deposition device by a substrate support according to an embodiment, FIG. 12 illustrates a graph showing a result of changing a magnetic force by a magnet unit included in a deposition device by a substrate support according to an embodiment, FIG. 13 illustrates a schematic cross-sectional view of a substrate support included in a deposition device according to an embodiment, and FIG. 14 illustrates a schematic cross-sectional view of a substrate support included in a deposition device according to an embodiment.

Compared to the comparative embodiment described above, as illustrated in FIG. 10, in the deposition device according to an embodiment, a magnetic force around an edge of the pattern 331 is distorted or deformed by the magnetic pattern 331.

As such, in an embodiment, as illustrated in the first curve GMz of FIG. 11, which shows the graph indicating the strength of the magnetic force along the z direction due to magnetic force distortion around the edge of the pattern 331, it is possible to obtain a result that the z-directional magnetic force Mz is decreased compared to the region corresponding to the upper peak of the first curve GMz illustrated in FIG. 7. As indicated by CC in FIG. 11, a y-directional width of a peak region having a highest z-directional magnetic force Mz may increase to obtain a first curve GMz having a flatter peak compared to the first curve GMz of FIG. 7.

As an example, in an embodiment, as illustrated in the second curve GMy of FIG. 12, which shows the graph indicating the strength of the magnetic force along the y direction due to magnetic force distortion around the edge of the pattern 331, it is possible to obtain a result that the y-directional magnetic force My is decreased compared to the region corresponding to the upper peak of the second curve GMy illustrated in FIG. 7. As indicated by DD in FIG. 12, a y-directional width of a peak region having a highest y-directional magnetic force My may increase to obtain a second curve GMy having a flatter peak compared to the second curve GMy of FIG. 7. It can be seen that even in a region where the y-directional magnetic force My is lowest, strength of a magnetic force decreases and a width in the y-direction increases.

FIG. 11 and FIG. 12 have a same effect of lowering the sharp peaks of the z-directional magnetic force Mz and the y-directional magnetic force My in an embodiment, respectively, and a difference thereof may vary depending on a disposition or arrangement or position of the pattern 331 included in the substrate support 335 as illustrated in FIG. 13 and FIG. 14.

Referring to FIG. 13, the pattern 331 included in the substrate support 335 according to an embodiment may be positioned by allowing a center thereof to be aligned with a center of each magnet 310 corresponding to a magnet unit. A y-directional width W1 of the pattern 331 may be smaller than a y-directional width of the corresponding magnet 310, but the disclosure is not limited thereto. For example, the y-directional width W1 of the pattern 331 may be greater than or equal to the y-directional width of each magnet 310. The y-directional width W1 of the pattern 331 is smaller than the pitch Pt of the magnet 310.

A graph showing the strength of the magnetic force according to the embodiment illustrated in FIG. 13 may correspond to FIG. 11 described above.

Referring to FIG. 14, according to an embodiment, a center of the pattern 331 included in the substrate support 335 may be positioned to correspond to a center of a space between corresponding neighboring magnets 310 among the magnets 310 of the magnet unit. A y-directional width W2 of the pattern 331 may be greater than a y-directional width Si of the space between the corresponding neighboring magnets 310, but the disclosure is not limited thereto. For example, the width W2 in the y direction of pattern 331 may be smaller than or equal to a distance between the neighboring magnets 310. Even in an embodiment, the y-directional width W2 of the pattern 331 is smaller than the pitch Pt of the magnet 310.

A graph showing the strength of the magnetic force according to the embodiment illustrated in FIG. 14 may correspond to FIG. 12 described above.

Figure 15:
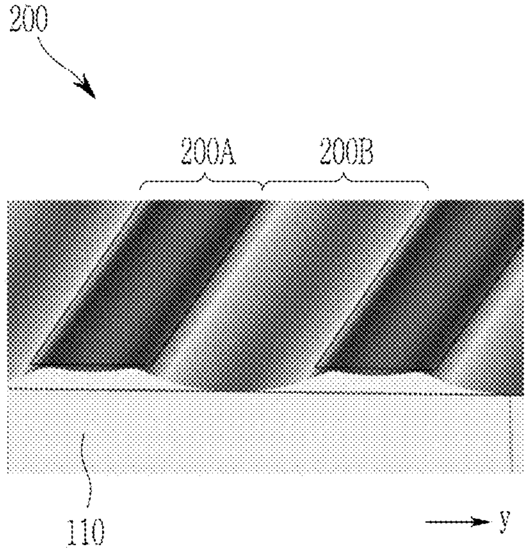
FIG. 15 illustrates a simulation result of a deposition mask that is bent by a magnetic force by a magnet unit and a substrate support included in a deposition device according to an embodiment.

FIG. 15 illustrates a simulation result of a deposition mask that is bent by a magnetic force by a magnet unit and a substrate support included in a deposition device according to an embodiment.

According to an embodiment, intensity at peak portions of the z-directional magnetic force Mz and the y-directional magnetic force My by the pattern 331 and the substrate support 335 of the magnet 310 may be reduced and a y-directional width thereof may be widened, thereby reducing an effect of a periodic magnetic force on the deposition mask 200. Referring to FIG. 15, according to an embodiment, the deposition mask 200 used in the deposition device has a shape that is periodically curved along the y-direction, but it can be seen that a height difference between a peak portion 200A and a valley portion 200B is small and it forms a flat shape compared to a shape of the deposition mask 200C according to the comparative embodiment illustrated in FIG. 8 described above.

In this way, according to an embodiment in which the substrate support may include the pattern 331 as in an embodiment, peak regions of the z-directional magnetic force Mz and the y-directional magnetic force My by the magnet 310 and the substrate support 335 may be distorted to reduce the magnetic force and also reduce a bending degree of the deposition mask 200. Accordingly, a variation in a thickness of a film deposited on the substrate 110 by the deposition mask 200 may be reduced, thereby reducing defects in which stripes are visually recognized.

According to an embodiment, the patterns 331 may be formed on a surface of surfaces of the support plate 330, which faces the magnet unit 300. For example, in case that the surface facing the magnet unit 300 among the surfaces of the support plate 330 is referred to as an upper surface and an opposite surface is referred to as a lower surface, the patterns 331 may be formed on the upper surface of the support plate 330.

Figure 16:
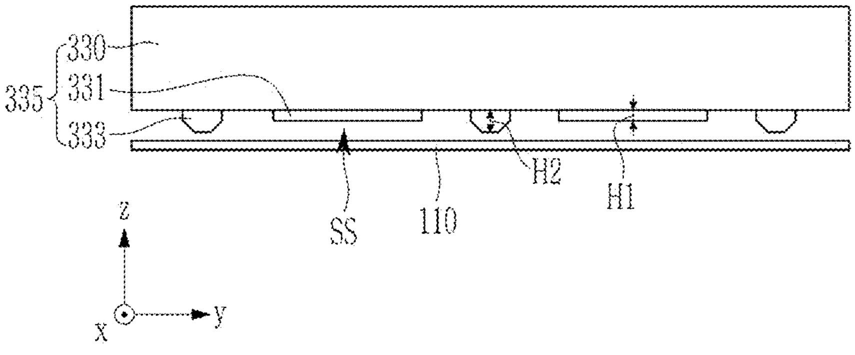
FIG. 16 illustrates a schematic cross-sectional view of a substrate support and a substrate included in a deposition device according to an embodiment.

FIG. 16 illustrates a schematic cross-sectional view of a substrate support and a substrate included in a deposition device according to an embodiment.

Referring to FIG. 16, according to an embodiment, the substrate support 335 of the deposition device is substantially the same as that of the above-described embodiment, but may further include protrusions 333 positioned on a surface facing the substrate 110. An upper surface of the substrate 110 supported by the substrate support 335 may contact a lower surface of the protrusion 333, and a space may be maintained between the lower surface of the support plate 330 and the upper surface of the substrate 110.

The pattern 331 may be positioned between adjacent protrusions 333. There is a space between the adjacent pattern 331 and the protrusions 333.

A thickness H1 of the pattern 331 in the z direction is smaller than a thickness H2 of the protrusion 333 in the z direction. For example, the thickness H2 of the protrusion 333 in the z direction may be approximately 200 μm, and the thickness H1 of the pattern 331 in the z direction may be approximately 10 μm. Accordingly, a space SS is maintained between the pattern 331 and the substrate 110 so that friction between the pattern 331 and the substrate 110 does not occur.

The protrusion 333 may include a same material or a similar material as the support plate 330, and may be integral with each other, or may be formed on a lower surface of the support plate 330. In case that the protrusion 333 is formed on the lower surface of the support plate 330, the protrusion 333 may include a same material or a similar material as the support plate 330 or a different material therefrom.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure and the appended claims.

What is claimed is:

1. A deposition device comprising:

a magnet part that includes magnets; and a substrate support that faces the magnet part and that supports a substrate, wherein the substrate support includes a support plate having a first surface facing the magnet part, and magnetic patterns formed on a second surface of the support plate, the support plate being interposed between the magnet part and the magnetic patterns, and each of the patterns corresponds to a space between neighboring magnets among the magnets or corresponds to the magnets.

2. The deposition device of claim 1, wherein the magnets are disposed in a first direction, and the patterns are disposed in the first direction.

3. The deposition device of claim 2, wherein the magnet part extends in a second direction that is perpendicular to the first direction, and the patterns extend in the second direction.

4. The deposition device of claim 2, wherein a center of each of the patterns is aligned with a center of a space between neighboring ones of the magnets.

5. The deposition device of claim 2, wherein a center of each of the patterns is aligned with a center of a corresponding one of the magnets.

6. The deposition device of claim 2, wherein a thickness of the patterns in a third direction is less than a thickness of the support plate in the third direction, a second direction is perpendicular to the first direction, and the third direction is perpendicular to the first direction and the second direction.

7. The deposition device of claim 6, wherein the substrate support includes protrusions facing the substrate, the patterns are disposed between adjacent protrusions, and a thickness of the patterns in the third direction is less than a thickness of the protrusions in the third direction.

8. The deposition device of claim 2, wherein the substrate support is disposed between the magnet part and the substrate.

9. The deposition device of claim 2, wherein a pitch of the magnets in the first direction is substantially equal to a pitch of the patterns in the first direction.

10. The deposition device of claim 1, further comprising:

a deposition mask disposed below the substrate, wherein the substrate support is disposed between the magnet part and the deposition mask.

11. The deposition device of claim 1, wherein the support plate includes a non-magnetic material.

12. The deposition device of claim 1, wherein the support plate includes a refrigerant.

13. A deposition device comprising:

a magnet part that includes magnets disposed in a first direction; and a substrate support, wherein the substrate support includes:

a support plate that has a first surface facing the magnet part and a second surface opposite to the first surface; and magnetic patterns formed on the second surface and arranged in the first direction, and the support plate is interposed between the magnet part and the magnetic patterns.

14. The deposition device of claim 13, wherein the magnet part extends in a second direction that is perpendicular to the first direction, and the patterns extend in the second direction.

15. The deposition device of claim 13, wherein a center of each of the patterns is aligned with a center of a space between neighboring ones of the magnets or a center of each of the magnets.

16. The deposition device of claim 13, wherein the patterns include a magnetic material.

17. The deposition device of claim 13, wherein a substrate is disposed at a side of the second surface of the substrate support, and the substrate support is disposed between the magnet part and the substrate.

* * * * *